United States Patent [19]
Noddin

[11] Patent Number: 5,973,290
[45] Date of Patent: Oct. 26, 1999

[54] LASER APPARATUS HAVING IMPROVED VIA PROCESSING RATE

[75] Inventor: David B. Noddin, Eau Claire, Wis.

[73] Assignee: W. L. Gore & Associates, Inc., Newark, Del.

[21] Appl. No.: 08/805,601

[22] Filed: Feb. 26, 1997

[51] Int. Cl.$^6$ .................................................. B23K 26/00
[52] U.S. Cl. ................................ 219/121.7; 219/121.71; 219/121.8
[58] Field of Search ........................... 219/121.7, 121.71, 219/121.8; 427/554, 555, 556; 264/400; 216/17, 65

[56] References Cited

U.S. PATENT DOCUMENTS

| | | |
|---|---|---|
| 3,953,566 | 4/1976 | Gore . |
| 4,348,253 | 9/1982 | Subbarao et al. . |
| 4,445,978 | 5/1984 | Whartenby et al. . |
| 4,473,737 | 9/1984 | Anthony .............................. 219/121.71 |

(List continued on next page.)

FOREIGN PATENT DOCUMENTS

| | | |
|---|---|---|
| 385911 | 9/1990 | European Pat. Off. . |
| 59-27791 | 2/1984 | Japan ................................ 219/121.71 |
| 86/02301 | 4/1986 | WIPO . |
| WO 90/01374 | 2/1990 | WIPO . |
| 90/03045 | 3/1990 | WIPO . |

OTHER PUBLICATIONS

Article, Lizotte et al., "Laser drilling speeds BGA packaging", Solid State Technology, Sep. 1996, pp. 120–128.
Article, Eskew et al., "A Laser drill and patterning system for low cost, rapid prototyping", ICEMCM '95, pp. 314–319.
Brochure, "IMPACT—Laser Processing Systems", Lumonics Corporation, 4 pages, No Publication Date.
Article, Tourne, "Laser Via Technologies for High Density MCM–L Fabrication", ICEMCM '95, pp. 71–76.
Article, Carey, "MCM–L Substrates for a 300 MHZ Workstation", ICEMCM '95, pp. 537–542.
Article, Patel et al., "Projection Laser Ablation Mask Alternatives", ICEMCM '95, pp. 320–326.
Technical Paper, Kosto et al., "Low Cost Through–Hole Activation Method for PTFE Based Substrates", IPC, pp. P6–5–1 through P6–5–8.
Article, Jain et al., "Large–Area, High Throughput, High–Resolution Patternmaking and Via–Drilling System", ICEMCM '95, pp. 327–335.
Article, Lemke, "Recent Developments in the Production and Application of Advanced Laminate Based MCMs and Chip Carriers", ICEMCM '95, pp. 235–240.
Article, Freda et al. "Laminate Based Substrates in Semiconductor Packages", ICEMCM '95, pp. 559–566.

*Primary Examiner*—Geoffrey S. Evans
*Attorney, Agent, or Firm*—Victor M. Genco, Jr.

[57] ABSTRACT

A laser via drilling system, and method of operation thereof, operates at an increased pulse repetition rate, but provides output pulses of sufficient energy and consistent pulse to pulse energy. In order to drill a via hole in a substrate, a pulsed laser beam is formed using a lithium triborate ($LiB_3O_5$) crystal for harmonic generation. The laser beam has an energy density that is greater than an ablation threshold of the substrate. A via hole is formed using the pulsed laser beam. The energy density of the pulsed laser beam is decreased to an energy density that is less than the first energy density and is less than the ablation threshold of the substrate. The pulsed laser beam is re-positioned to a site of a next via to be formed. The energy density of the pulsed laser beam is increased back to the original energy density and a next via hole is formed. The energy density of the pulsed laser beam is decreased by increasing the pulse repetition rate of the beam. Likewise, the energy density of the pulsed laser beam is increased by decreasing the pulse repetition rate of the beam.

27 Claims, 6 Drawing Sheets

U.S. PATENT DOCUMENTS

| | | |
|---|---|---|
| 4,482,516 | 11/1984 | Bowman et al. . |
| 4,547,836 | 10/1985 | Anthony . |
| 4,595,428 | 6/1986 | Anthony et al. . |
| 4,647,476 | 3/1987 | Anthony . |
| 4,705,762 | 11/1987 | Ota et al. . |
| 4,720,308 | 1/1988 | Anthony et al. . |
| 4,901,136 | 2/1990 | Neugebauer et al. . |
| 4,913,656 | 4/1990 | Gordon et al. . |
| 4,943,032 | 7/1990 | Zdeblick . |
| 4,959,119 | 9/1990 | Lantzer ............................ 219/121.69 |
| 4,985,296 | 1/1991 | Mortimer, Jr. . |
| 5,009,607 | 4/1991 | Gordon et al. . |
| 5,019,997 | 5/1991 | Haller . |
| 5,071,359 | 12/1991 | Arnio et al. . |
| 5,108,785 | 4/1992 | Lincoln et al. . |
| 5,171,964 | 12/1992 | Booke et al. . |
| 5,224,265 | 7/1993 | Dux et al. . |
| 5,245,751 | 9/1993 | Locke et al. . |
| 5,251,097 | 10/1993 | Simmons et al. . |
| 5,293,025 | 3/1994 | Wang ................................ 219/121.71 |
| 5,293,626 | 3/1994 | Priest et al. . |
| 5,331,203 | 7/1994 | Wojnarowski et al. . |
| 5,355,397 | 10/1994 | Hanson et al. . |
| 5,377,404 | 1/1995 | Berg . |
| 5,378,313 | 1/1995 | Pace . |
| 5,378,318 | 1/1995 | Weling et al. . |
| 5,391,516 | 2/1995 | Wojnarowski et al. . |
| 5,428,803 | 6/1995 | Chen et al. . |
| 5,442,475 | 8/1995 | Bausman et al. . |
| 5,459,634 | 10/1995 | Nelson et al. . |
| 5,466,892 | 11/1995 | Howard et al. . |
| 5,509,553 | 4/1996 | Hunter, Jr. et al. . |
| 5,539,175 | 7/1996 | Smith et al. ..................... 219/121.71 |
| 5,541,367 | 7/1996 | Swamy . |
| 5,541,731 | 7/1996 | Freedenberg et al. . |
| 5,593,606 | 1/1997 | Owen et al. ..................... 219/121.71 |
| 5,614,114 | 3/1997 | Owen ................................ 219/121.71 |

LASER APPARATUS HAVING IMPROVED VIA PROCESSING RATE

FIELD OF THE INVENTION

The present invention relates to a laser via drilling apparatus and method of operation thereof, in which the laser source uses LBO crystals for frequency-multiplication and the pulse repetition rate is varied to improve power stability.

BACKGROUND OF THE INVENTION

Interconnection and packaging related issues are among the main factors that determine not only the number of circuits that can be integrated on a chip, but also the performance of the chip. These issues have gained in importance as advances in chip design have led to reduced feature sizes of transistors and enlarged die sizes. Industry has come to realize that merely having a fast chip will not result in a fast system; it must also be supported by equally fast and reliable packaging.

Essentially, packaging supplies the chip with signals and power, and performs other functions such as heat removal, physical support and protection from the environment. Another important function is simply to redistribute the tightly packed I/Os off the chip to the I/Os of a printed wiring board.

An example of a package-chip system is the "flip-chip" integrated circuit mounted on an area array organic package. Flip-chip mounting entails placing solder bumps on a die or chip, flipping the chip over, aligning the chip with the contact pads on a substrate, and reflowing the solder balls in an oven to establish bonding between the chip and the substrate. This method is advantageous in certain applications because the contact pads are distributed over the entire chip surface rather than being confined to the periphery, as in wire bonding and most tape-automated bonding (TAB) techniques. As a result, the maximum number of I/O and power/ground terminals available can be increased, and signal and power/ground interconnections can be more efficiently routed on the chips.

However, with existing flip-chip packaging techniques, thermal expansions due to mismatches between the semiconductor chip and the substrate can cause strains at the bumps, and thus, could lead to failure. Regardless of which packaging technique is employed, material issues such as the aforementioned thermally induced strain causes a chip package designer to select and match materials with great care.

In the manufacture of integrated circuit packaging, the chip package designer attempts to obtain ever greater wiring densities while at the same time forming interconnections between adjacent layers that provide reliable circuits with as little inductance and resistance as possible. Thus, the formation of high quality via holes, or vias, that are used for interconnections, is an important aspect of forming high quality interconnections.

It has been known to use lasers to form vias in multi-layered laminated substrates. Laser pulses are applied to drill through the substrate as desired. Each laser pulse applied has an energy density that is greater than an ablation threshold of the material and removes a small amount of material. A large number of pulses are applied until the necessary material has been removed. In a typical via drilling application, pulses are applied at a repetition rate of 2,000 to 10,000 per second, for a short burst of less than one second in duration. The beam is then turned off and moved to the location of the next via to be formed, where another short burst of pulses is applied.

Increasing the pulse repetition rate of a laser typically decreases the energy density of each output pulse. If the pulse repetition rate is increased too much, the pulse energy density will fall below the ablation threshold. This effect produces an effective maximum pulse rate at which a particular laser may be used for via formation. Increasing the pulse repetition rate during via formation, while maintaining an energy density sufficient to exceed the ablation threshold would allow the time necessary to form each via to be decreased. This would lead to a decrease in the cost of manufacturing electrical component packages. On the other hand, in order to form consistent, high-quality vias, it is important that the applied energy be consistent from pulse to pulse. A need arises for a laser via drilling system that operates at an increased pulse repetition rate, but provides output pulses of sufficient energy and consistent pulse to pulse energy.

SUMMARY OF THE INVENTION

The present invention is a laser via drilling system, and method of operation thereof, that operates at an increased pulse repetition rate, but provides output pulses of sufficient energy and consistent pulse to pulse energy.

In order to drill a via hole in a substrate, according to the present invention, a pulsed laser beam is formed using an LBO crystal for harmonic generation. The laser beam has an energy density that is greater than an ablation threshold of the substrate. A via hole is formed using the pulsed laser beam. The energy density of the pulsed laser beam is decreased to an energy density that is less than the first energy density and is less than the ablation threshold of the substrate. The pulsed laser beam is re-positioned to a site of a next via to be formed. The energy density of the pulsed laser beam is increased back to the original energy density and a next via hole is formed.

The energy density of the pulsed laser beam is decreased by increasing the pulse repetition rate of the beam. Likewise, the energy density of the pulsed laser beam is increased by decreasing the pulse repetition rate of the beam.

BRIEF DESCRIPTION OF THE DRAWINGS

The details of the present invention, both as to its structure and operation, can best be understood by referring to the accompanying drawings, in which like reference numbers and designations refer to like elements.

DETAILED DESCRIPTION OF THE INVENTION

Figure 1:
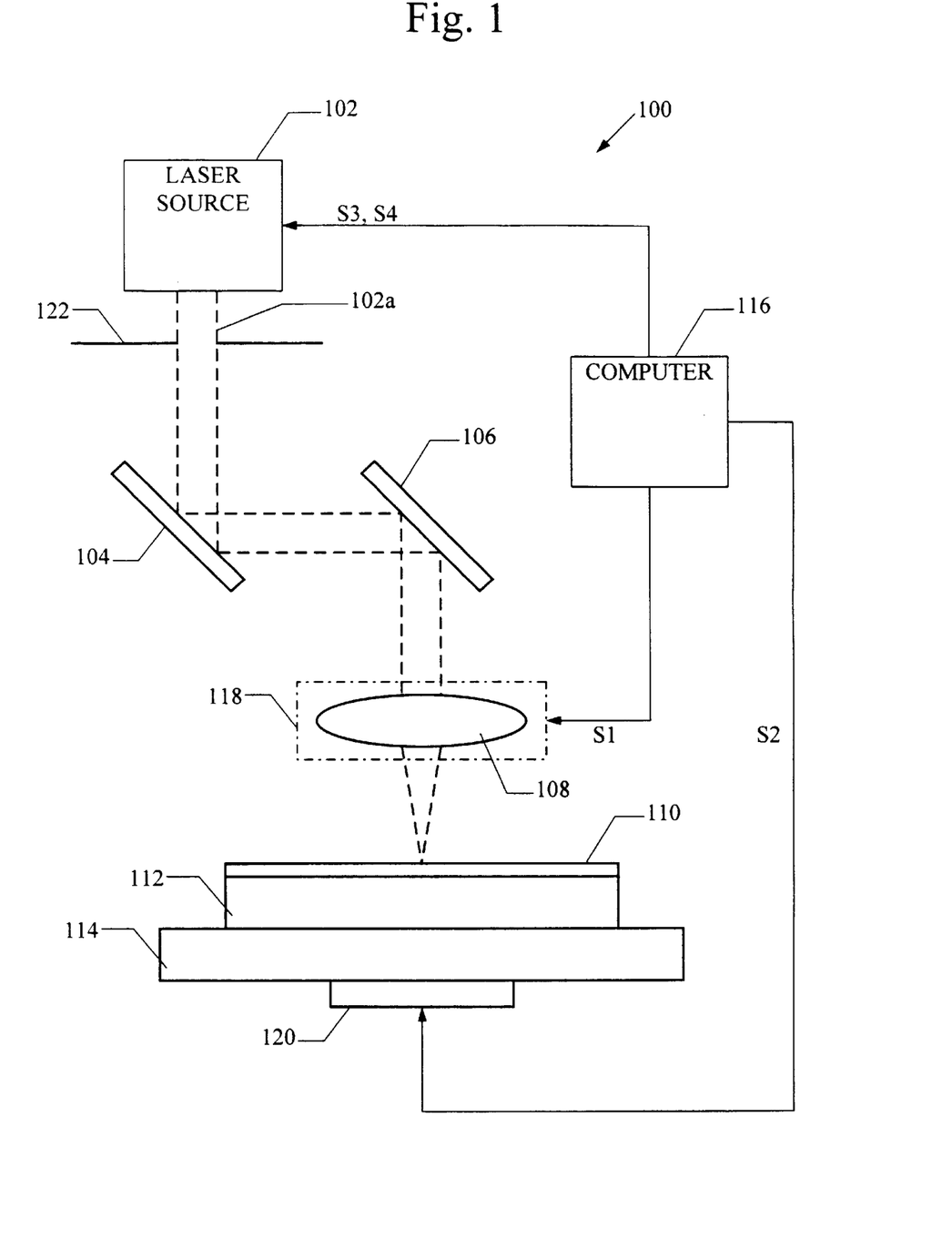
FIG. 1 is a schematic block diagram of a laser system for forming vias.

Vias may be formed using the laser system 100 shown in FIG. 1. Laser system 100 includes a laser source 102 which outputs a pulsed laser beam 102a that is directed through a laser optic system. The optic system includes mirrors 104 and 106, and a focusing lens 108 which directs a focused beam through a patterned mask 110, which is used when blind-vias are formed, but not when through vias are formed, onto a workpiece 112 positioned on an X-Y positioning table 114. The focused beam forms a focal spot on the substrate underlying the mask 110. The focal spot can be circular or oval in shape.

Workpiece 112 of FIG. 1 is a laminated substrate that includes a plurality of alternately disposed dielectric and conductive layers. After additional laminations are applied, the blind-vias or through-vias formed in one step become buried vias. Blind-vias can also be formed on the bottom-most or top-most dielectric layer.

Laser system 100 includes a controlling device, such as computer 116, that controls the position of the focal spot of the laser beam with respect to workpiece 112. Computer 116 controls the positioning of the focal spot by issuing control signals to a focal spot positioning mechanism. An example of such a mechanism is actuators 118 and 120. Computer 116 issues control signals S1 to actuator 118, which moves lens 108 in the X direction. Computer 116 further issues control signals S2 to an actuator 120, which moves the positioning table 114 in the Y direction. The combined X and Y motion allows system 100 to move the laser beam in a manner programmed by computer 116 to form a desired type of via.

Another example of a focal spot positioning mechanism is the use of galvanometers for controlling the position of mirrors 104 and 106. Galvanometers of this type are commercially available and can be installed in commercially available laser apparatuses. In any event, computer 116 can be pre-programmed for establishing the pattern of motion of the beam spot to form the desired vias. Moreover, computer 116 is operatively coupled to laser source 102 for establishing lasing parameters such as direction, speed of the beam path (in millimeters per second), pulse repetition rate, and power.

Signal S3, which is output from computer 116, controls the pulse repetition rate of laser source 102, which affects peak power both by changes in average power and pulses per second, as well as the pulse duration in nanoseconds (ns). This is best done by changing pulse intervals with electronic or acousto-optic Q-switching. Power per pulse can also be changed by adjusting the current to the laser excitation source, such as in arc lamp. This is controlled by signal S4, which is also output from computer 116.

Figure 2A:
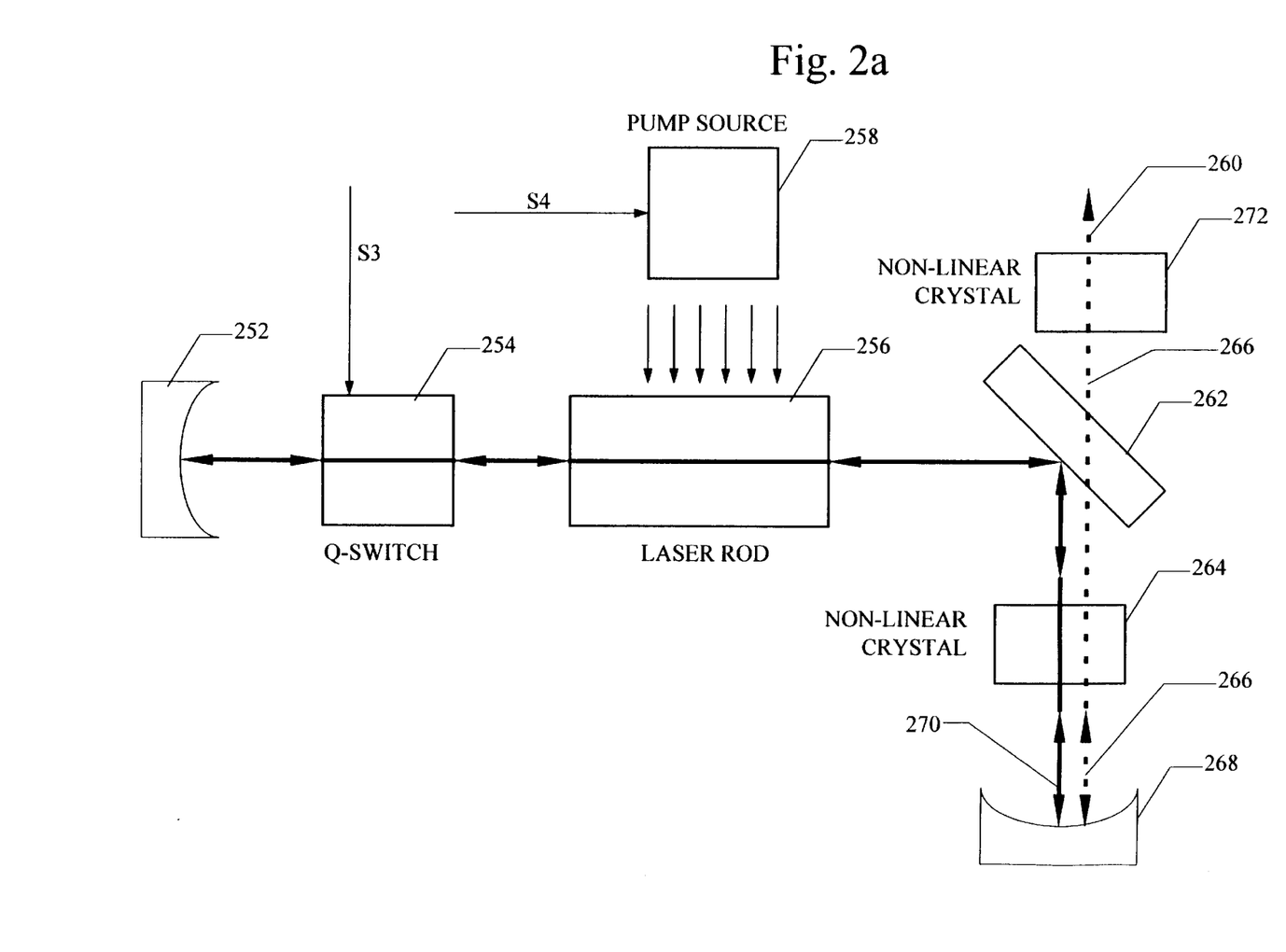
FIG. 2a is a schematic block diagram of the laser source shown in FIG. 1, according to the present invention.
Figure 2B:
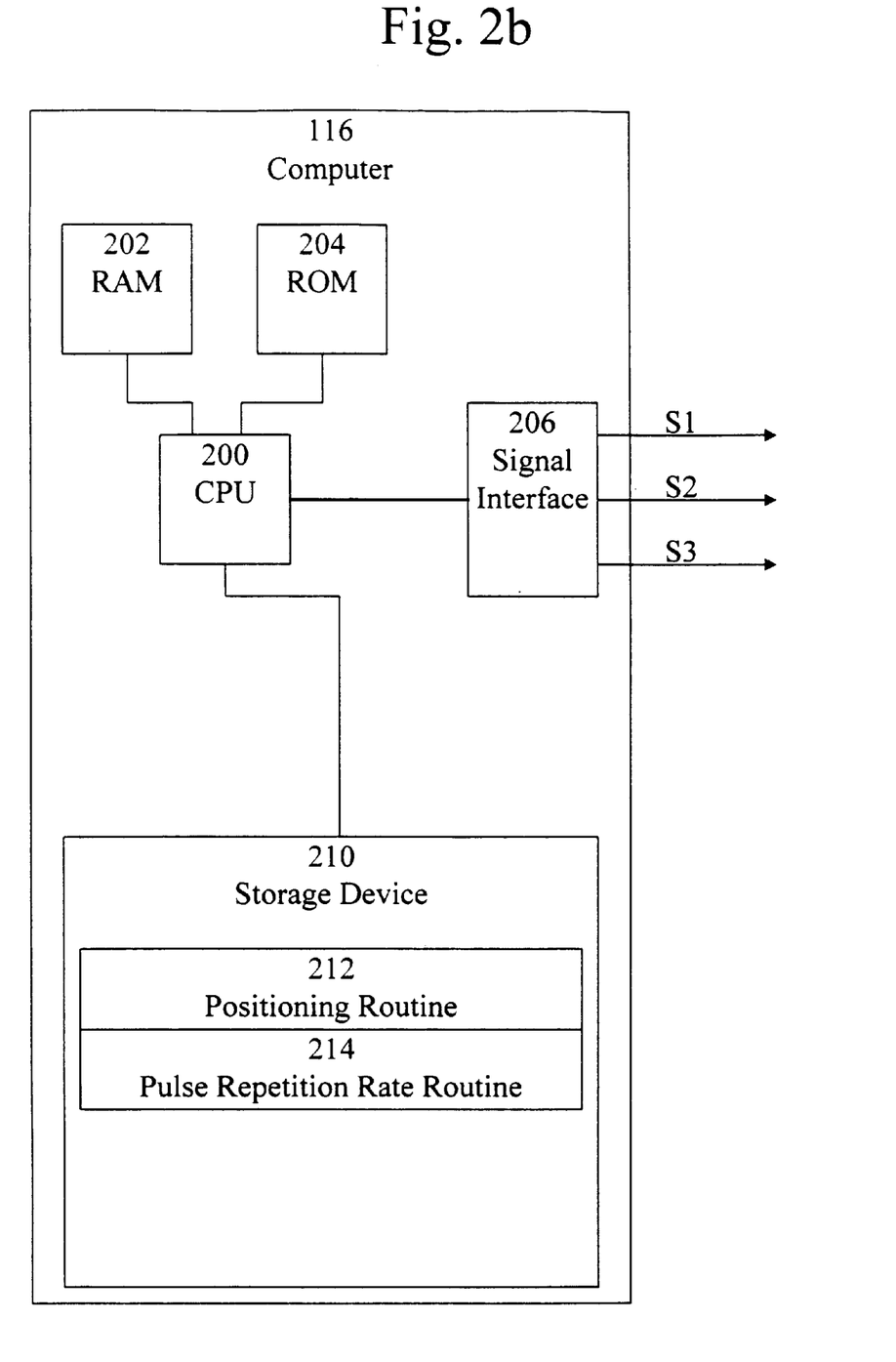
FIG. 2b is a block diagram of the computer shown in FIG. 1, according to the present invention.

An exemplary control computer 116 is shown in FIG. 2b. Computer 116 includes central processing unit (CPU) 200, which is connected to random access memory (RAM) 202, read-only memory (ROM) 204, signal interface 206, and storage device 210. CPU 200 typically comprises a microprocessor, for example, an INTEL PENTIUM processor. RAM 202 and ROM 204 store program instructions that are executed by CPU 200 and data that is used during program execution. Signal interface 206 outputs S1, S2 and S3, shown in FIG. 1, in response to commands from CPU 200.

Storage device 210 includes positioning routine 212 and pulse repetition rate routine 214. Positioning routine 212 controls the generation of signals S1 and S2, which control the focal spot positioning mechanism. Pulse repetition rate routine 214 controls the generation of signal S3, which controls the pulse repetition rate of laser source 102.

The preferred pattern of movement of the laser focal spot is "trepanning" the spot, in which the beam spot starts in the center of the desired via, and gradually spirals outwardly to an outer diameter of the via. At that point the beam is caused to orbit around the via center for as many revolutions as is determined necessary for the particular via. Upon completion, the focal spot is caused to spiral back to the center and thereafter awaits the next command. An example of a trepanning velocity is 10 millimeters per second (mmps), but can be 0.4 to 75 mmps.

Typically, multiple vias are being formed in a single workpiece. Upon completion of one via, the laser is turned off and the focal spot is moved to the next via site. Since the laser is turned off, no radiation illuminates the workpiece, and no damage to the workpiece can occur. When the focal spot has arrived at the next via site, the laser beam is turned back on and the next via is formed.

When a quadrupled Nd:YAG laser (wavelength equals 266 nm) is used for laser drilling, the entrance quality of the vias can be ensured by correcting for astigmatism in the laser beam. A plate 122 is interposed in the beam path between laser source 102 and substrate or workpiece 112. In particular, beam 102a passes through an aperture formed in plate 122. Plate 122 is positioned in the beam path at a point that is equal to or less than the Rayleigh range of the beam. The size of aperture 122 is selected to block the side lobes of beam 102a.

Examples of lasers that are suitable for forming vias are well-known Nd:YAG (neodymium yttrium aluminum garnet) lasers that are frequency-multiplied using well-known techniques. For example, a Nd:YAG laser that emits at 1065 nm may be frequency-tripled to emit at a 355 nm wavelength or frequency-quadrupled to emit at a 266 nm wavelength. Such lasers are commercially available as the Model 5000 Laser Processing System produced by Electro Scientific Industries of Portland, Oreg., USA.

A typical conventional frequency-multiplied Nd:YAG laser apparatus, which may be used as laser source 102 in FIG. 1, is shown in FIG. 2. Although, a laser source having a folded optical path is shown in FIG. 2a as an example, the present invention is equally applicable to a laser source having an inline optical path. The operation of an inline laser source is similar to the operation of the folded laser source described below.

A laser resonator is formed by the arrangement of a first resonator mirror 252 and a second resonator mirror 268 into a closed optical path. Inside the resonator is a Nd:YAG laser rod 256 that is pumped by an optical pump source 258 such as a Kr arc lamp. Inside the resonator is also nonlinear crystal 264 for second harmonic generation (SHG) and a folding mirror 262. A laser beam 270 inside the resonator bounces back and forth between first and second resonator mirrors 252 and 268, reflects off folding mirror 262 and propagates through laser rod 256 and non-linear crystal 264. Laser rod 256 has optical gain at a particular wavelength, known as the fundamental wavelength, which determines the wavelength of the laser beam 24 inside the resonator. In a Nd:YAG laser, the fundamental wavelength is typically 1064 nm. When laser beam 24 propagates through nonlinear crystal 264, in a direction from folding mirror 262 to second resonator mirror 268, a second harmonic beam 266 is generated. The second harmonic beam 266 has a wavelength of 532 nm, half the wavelength of beam 270. Second resonator mirror 268 is highly reflective at both the fundamental wavelength and the second harmonic wavelength and both beams reflect back through nonlinear crystal 264. On this second pass, more second harmonic energy is produced. Folding mirror 262 is highly reflective at the fundamental wavelength and highly transmissive at the second harmonic wavelength, thus second harmonic beam 266 passes through folding mirror 262. Second harmonic beam 266 then propagates through nonlinear crystal 272, generating a beam 260 that is a second harmonic of second harmonic beam 266. Beam 260 is therefore a fourth harmonic of the fundamental wavelength and has a wavelength of 266 nm.

Folding mirror 262 provides a means of outputting second harmonic beam 266 from the laser resonator. Beam 270 remains inside the laser resonator and passes through Q-switch 254. Q-switch 254 changes laser beam 270 to a train of short pulses with high peak power. Pulsing beam 270 causes second harmonic beam 266 and fourth harmonic beam 260 to also be pulsed.

Figure 3A:
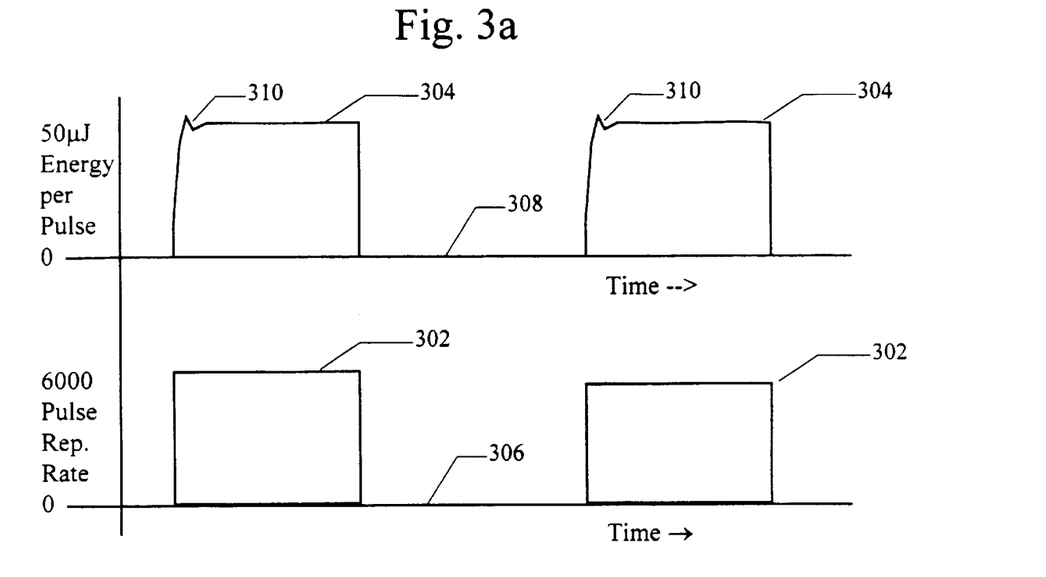
FIG. 3a shows the operation of a prior art laser via formation system incorporating BBO crystals.
Figure 3B:
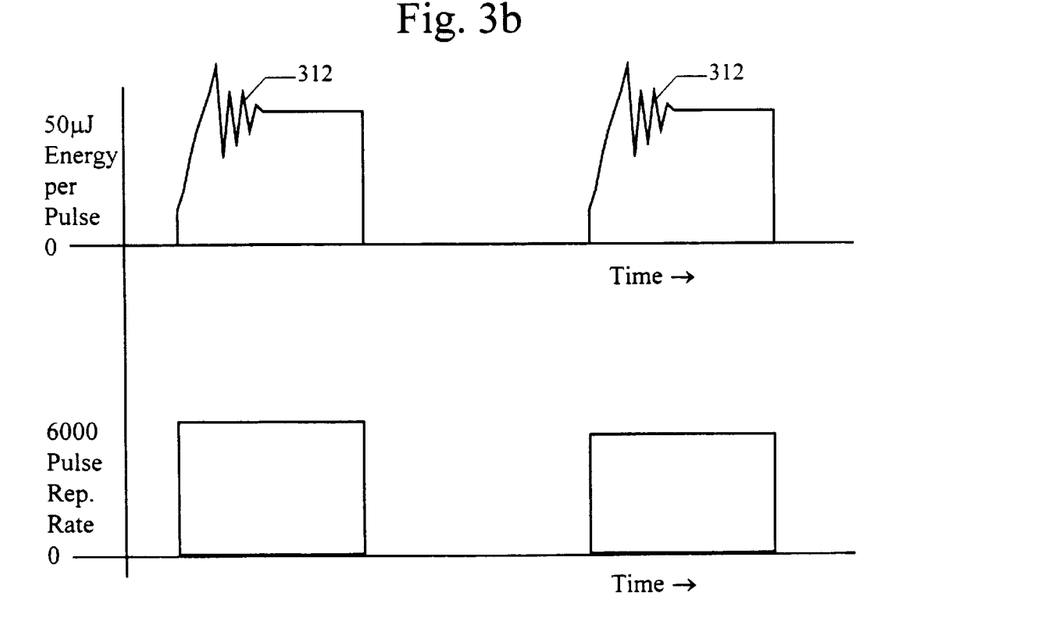
FIG. 3b shows the operation of a prior art laser via formation system incorporating LBO crystals.

Well-known harmonic-generating materials include beta barium borate, $\beta\text{-BaB}_2\text{O}_4$ (BBO), potassium titanyl phosphate, $\text{K-TiOPO}_4$ (KTP) and lithium tri-borate, $\text{LiB}_3\text{O}_5$ (LBO). In the prior art, BBO is used in applications requiring short bursts of high-repetition rate pulses, such as laser via formation, because BBO provides superior power stability, as shown in FIGS. 3a and 3b. When a laser beam is first applied to a nonlinear crystal, there is a brief period of instability, or lag time, until the crystal heats up to its operating temperature.

The normal operation of a typical conventional laser via formation system is shown in FIG. 3a. The laser source is a conventional frequency-multiplied Nd:YAG laser that uses BBO crystals. During drilling of a via hole, the laser source is typically operated at a pulse repetition rate of 6000 per second 302 and a pulse energy of 50 $\mu$J 304. Between drilling operations, while the beam target is being moved, the laser is off 306, producing no energy 308. When the beam target is in place at the next via location, the laser is turned on and again operated at a pulse repetition rate of 6000 per second 302 and a pulse energy of 50 $\mu$J 304. Although the BBO crystals exhibit some lag time 310, the power stability is within acceptable limits. The energy density of the pulses emitted from a BBO crystal typically vary no more than 10% to 20%.

In a conventional system, LBO and KTP crystals would exhibit inferior power stability. The performance of LBO crystals in a conventional system similar to that used for FIG. 3a, and under similar operating conditions, is shown in FIG. 3b. During the lag time 312, which typically lasts 10 to 20 pulses, the pulses output from the crystal have unacceptable energy stability. Conventional laser drilling systems have been unable to use LBO and KTP crystals for laser via formation, because the initial poor stability pulses can damage the substrate material, producing poorly formed vias.

BBO crystals have significantly lower frequency-multiplication efficiency than LBO or KTP crystals. For example, a laser beam having a wavelength of 1064 nm and an average power of 10 watts would be frequency-doubled by a BBO crystal to a beam having a wavelength of 532 nm and an average power of only 2.5 to 4 watts. A 10 watt 1064 nm beam would be frequency-quadrupled by two BBO crystals to a 266 nm beam having an average power of only 300 to 400 milliwatts (mW). A typical via forming application requires a pulse energy of at least 40 microjoules ($\mu$J), with a pulse width of 40 to 100 nanoseconds (ns), to exceed the ablation threshold, although pulse energies of at least 50 $\mu$J are generally preferred. A 266 nm laser with an average output power of 300 to 400 mW would typically allow a maximum pulse repetition rate of approximately 6000 pulses per second.

In the present invention, LBO crystals are used instead of the BBO crystals found in conventional systems. The increased conversion efficiency of LBO crystals results in a 1064 nm laser that is frequency-quadrupled by LBO crystals to 266 nm and has an average power of 500 to 5000 mW. This allows laser via formation to be carried out at pulse repetition rates of 10,000 to 20,000 pulses per second.

Figure 3C:
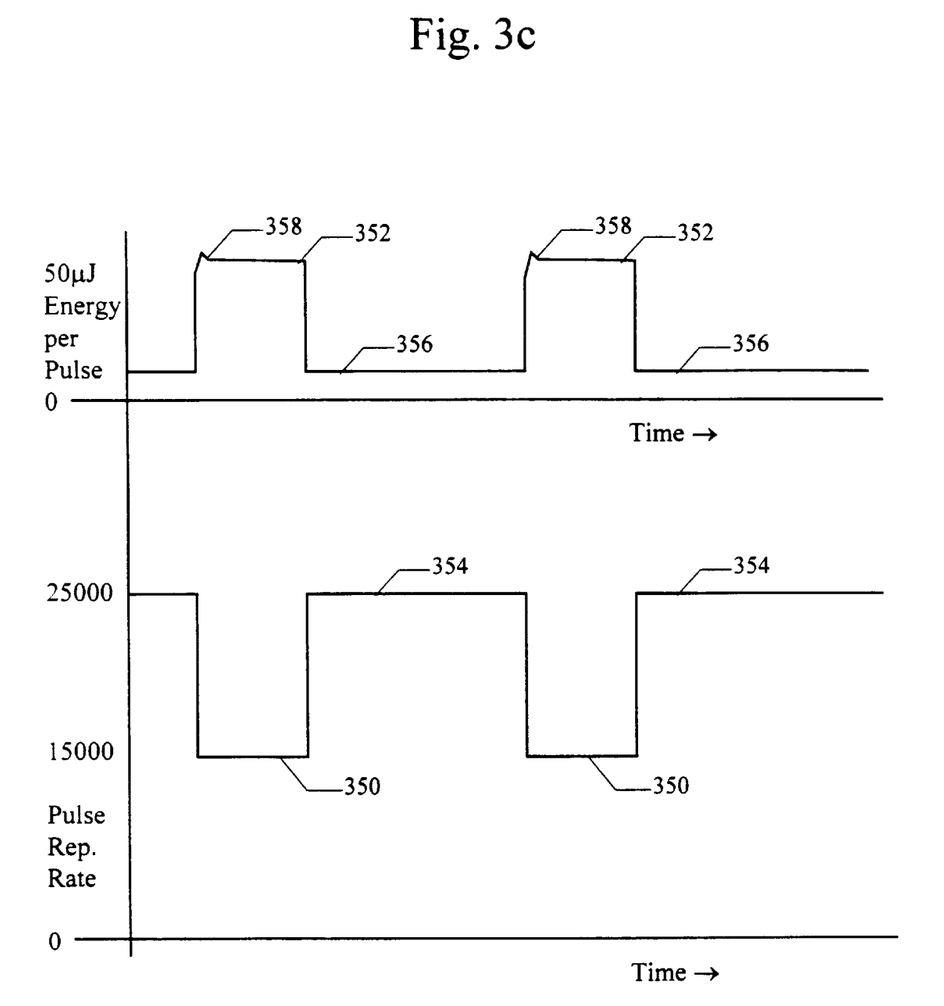
FIG. 3c shows the operation of a laser via formation system incorporating LBO crystals, according to the present invention.

In contrast to conventional laser drilling systems, the present invention successfully utilizes LBO crystals because the present invention avoids the power instability that prevented LBO crystals from being used in prior art applications. In the present invention, power instability during the lag time is avoided by not turning the laser off between via sites. As shown in FIG. 3c, during drilling of a via hole, the laser source is operated at a pulse repetition rate of 10,000 to 20,000 per second 350 and a pulse energy of at least 40 $\mu$J, but preferably 50 $\mu$J 352. Between drilling operations, while the beam target is being moved, the laser is operated at a pulse repetition rate of 20,000 to 50,000 per second 354, which causes the laser pulse energy to fall to 5–15 $\mu$J 356. When the beam target is in place at the next via location, the pulse repetition rate is lowered to 10,000 to 20,000 per second 350, which produces a pulse energy of at least 40 $\mu$J, but preferably 50 $\mu$J 352. This operation causes the crystal to remain near its operating temperature, resulting in improved power stability during the lag time 358.

In a conventional via forming apparatus, the laser is turned off as the focal spot is moved to the next via site. In the present invention, the laser is on, at a reduced power level, as the focal spot is moved to the next via site.

The reduced power level, 5–15 $\mu$J per pulse, is well below the ablation threshold of typical packaging and circuit board materials. In addition, the focal spot is moved at a higher speed than during the drilling operation, typically 15–20 millimeters (mm) per second. Because the laser beam is being moved quickly to the next via site, it never hits a location on the workpiece more than once. In most material, this is sufficient to reduce damage to the workpiece to 5–10 microns ($\mu$m) imprints. To eliminate even this minor damage, the workpiece can be coated with a protective coating thicker than 5–10 $\mu$m, which effectively prevents substantially all damage to the workpiece itself.

Figure 4:
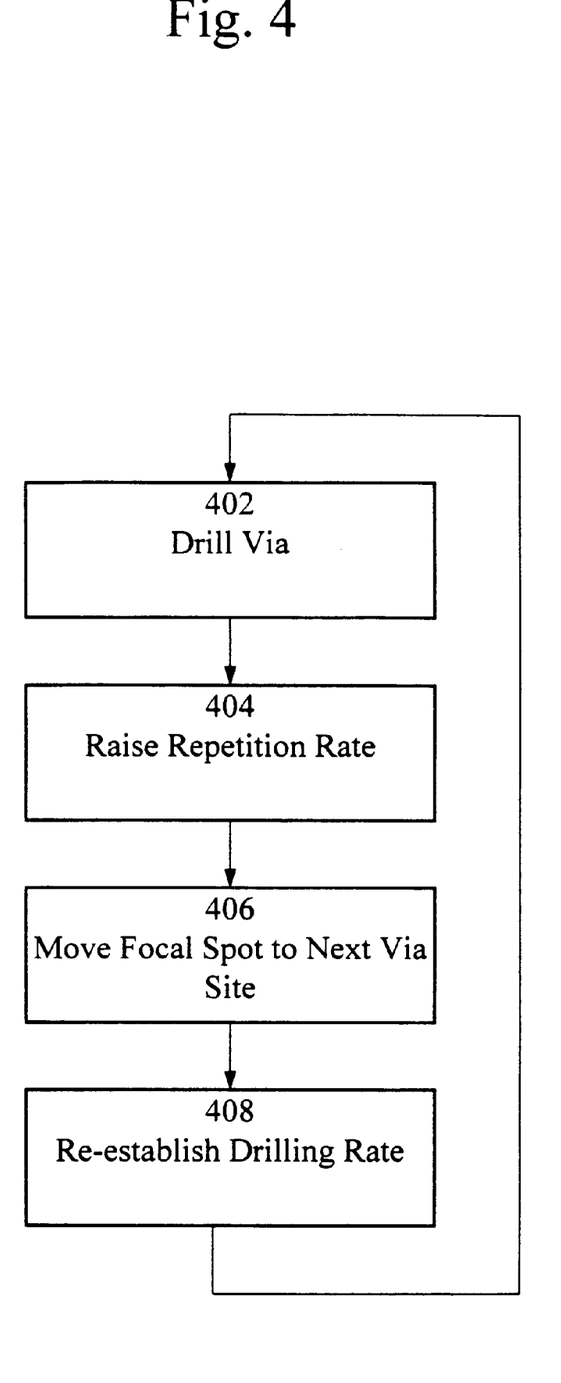
FIG. 4 is a flow diagram of a via drilling process, according to the present invention.

A process of laser drilling vias, according to the present invention, is shown in FIG. 4. The process begins with step 402, in which a via is drilled using a drilling pulse repetition rate of 10,000 to 20,000 pulses per second and a pulse energy of at least 40 $\mu$J, but preferably 50 $\mu$J. In step 404, the pulse repetition rate is raised to 20,000 to 50,000 pulses per second and the pulse energy falls to 5–15 $\mu$J. In step 406, the focal spot is moved to the site of the next via to be drilled. In step 408, the drilling pulse repetition rate is re-established. The process then loops back to step 402 and the next via is drilled.

While the present invention has been described in connection with the illustrated embodiments, it will be appreciated and understood that modifications may be made without departing from the true spirit and scope of the invention.

What is claimed is:

1. A method of forming vias in a substrate, comprising the steps of:

forming a pulsed laser beam using a lithium triborate crystal for harmonic generation, the pulsed laser beam having a first energy density;

forming a via using the pulsed laser beam;

decreasing the energy density of the pulsed laser beam to a second energy density that is greater than zero and less than the ablation threshold of the substrate;

re-positioning the pulsed laser beam to a site of a next via to be formed, wherein during re-positioning, the pulsed laser beam is operated at the second energy density;

increasing the energy density of the pulsed laser beam to the first energy density; and forming a next via.

2. The method of claim 1, wherein the first energy density is greater than an ablation threshold of the substate.

3. The method of claim 1, wherein the first energy density is $\geq 40$ μJ per pulse.

4. The method of claim 3, wherein the second energy density is $\geq 15$ μJ per pulse.

5. The method of claim 1, wherein the step of decreasing the energy density of the pulsed laser beam comprises the step of:

increasing the pulse repetition rate of the pulsed laser beam, whereby the energy density is decreased.

6. The method of claim 5, wherein the pulse repetition rate of the pulsed laser beam is increased to $\geq 20,000$ pulses per second.

7. The method of claim 6, wherein the step of increasing the energy density of the pulsed laser beam comprises the step of:

decreasing the pulse repetition rate of the pulsed laser beam, whereby the energy density is increased.

8. The method of claim 7, wherein the pulse repetition rate of the pulsed laser beam is decreased to $\leq 20,000$ pulses per second.

9. A system for forming vias in a substrate, comprising:

means for forming a pulsed laser beam having a first energy density;

means for forming a via using the pulsed laser beam;

means for decreasing the energy density of the pulsed laser beam to a second energy density that is greater than zero and less than the ablation threshold of the substrate;

means for re-positioning the pulsed laser beam to a site of a next via to be formed, wherein during re-positioning, the pulsed laser beam is operated at the second energy density;

means for increasing the energy density of the pulsed laser beam to the first energy density; and means for forming a next via.

10. The system of claim 9, wherein the means for forming a pulsed laser beam comprises a lithium triborate crystal for harmonic generation.

11. The system of claim 10, wherein the first energy density is greater than an ablation threshold of the substrate.

12. The system of claim 10, wherein the first energy density is $\geq 40$ μJ per pulse.

13. The system of claim 12, wherein the second energy density is $\leq 15$ μJ per pulse.

14. The system of claim 10, wherein the means for reducing the energy density of the pulsed laser beam comprises:

means for increasing the pulse repetition rate of the pulsed laser beam.

15. The system of claim 14, wherein the pulse repetition rate of the pulsed laser beam is increased to $\geq 20,000$ pulses per second.

16. The system of claim 15, wherein the means for increasing the energy density of the pulsed laser beam comprises:

means for decreasing the pulse repetition rate of the pulsed laser beam, whereby the energy density is increased.

17. The system of claim 16, wherein the pulse repetition rate of the pulsed laser beam is decreased to $\leq 20,000$ pulses per second.

18. A system for forming vias, comprising:

a laser source outputting a pulsed laser beam using a lithium triborate crystal for harmonic generation, responsive to an input signal controlling the energy density of the pulses;

a laser focal spot positioning mechanism responsive to an input signal controlling the location of the laser spot on a workpiece; and a computer system comprising:

a processor coupled to the input of the laser source and to the input of the laser spot mover, and a memory containing program instructions executable by the processor for controlling the laser focal spot positioning mechanism so as to perform the steps of:

forming a pulsed laser beam having a first energy density greater than an ablation threshold of the substrate;

forming a via using the pulsed laser beam;

reducing the first energy density of the pulsed laser beam to a second energy density that is greater than zero and less than the ablation threshold of the substrate;

re-positioning the pulsed laser beam to a site of a next via to be formed, wherein during re-positioning, the pulsed laser beam is operated at the second energy density;

increasing the energy density of the pulsed laser beam to the first energy density; and forming the next via.

19. The system of claim 18, wherein the first energy density is greater than an ablation threshold of the substrate.

20. The system of claim 19, wherein the second energy density is less than the ablation threshold of the substrate.

21. The system of claim 18, wherein the first energy density is $\geq 40$ μJ per pulse.

22. The system of claim 21, wherein the second energy density is $\leq 15$ μJ per pulse.

23. The method of claim 18, wherein the energy density of the pulsed laser beam is reduced by increasing the pulse repetition rate of the pulsed laser beam.

24. The system of claim 23, wherein the means for reducing the energy density of the pulsed laser beam comprises:

means for increasing the pulse repetition rate of the pulsed laser beam.

25. The system of claim 23, wherein the pulse repetition rate of the pulsed laser beam is increased to $\geq 20,000$ pulses per second.

26. The system of claim 25, wherein the means for increasing the energy density of the pulsed laser beam comprises:

means for decreasing the pulse repetition rate of the pulsed laser beam, whereby the energy density is increased.

27. The system of claim 26, wherein the pulse repetition rate of the pulsed laser beam is decreased to $\leq 20,000$ pulses per second.

* * * * *